United States Patent
Cohen et al.

(10) Patent No.: US 8,800,952 B2
(45) Date of Patent: Aug. 12, 2014

(54) REMOVING MATERIAL FROM DEFECTIVE OPENING IN GLASS MOLD AND RELATED GLASS MOLD FOR INJECTION MOLDED SOLDER

(75) Inventors: Jerome D. Cohen, Poughquag, NY (US); Robert G. Haas, Wappingers Falls, NY (US); Enrico Herz, Frauendorf (DE); Michael Teich, Moritzburg (DE); Christopher L. Tessler, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 13/432,966

(22) Filed: Mar. 28, 2012

(65) Prior Publication Data

US 2012/0186771 A1    Jul. 26, 2012

Related U.S. Application Data

(62) Division of application No. 12/014,959, filed on Jan. 16, 2008, now Pat. No. 8,237,086.

(51) Int. Cl.
*B23K 26/36* (2014.01)

(52) U.S. Cl.
USPC ............. 249/119; 249/62; 249/134; 156/60; 219/121.85

(58) Field of Classification Search
CPC ...... B23K 26/36; B08B 7/0042; B29C 33/74; H01L 21/441
USPC .......... 249/119, 61–62, 114.1–116, 134–135; 156/60; 216/79–80, 99; 219/121.65, 219/121.83, 121.85
See application file for complete search history.

(56) References Cited

U.S. PATENT DOCUMENTS

| | | | |
|---|---|---|---|
| 4,081,653 | A | 3/1978 | Koo et al. |
| 4,190,759 | A | 2/1980 | Hongo et al. |
| 5,244,143 | A | 9/1993 | Ference et al. |
| 5,662,762 | A | 9/1997 | Ranalli |

(Continued)

FOREIGN PATENT DOCUMENTS

| | | |
|---|---|---|
| DE | 102007004253 A1 | 7/2008 |
| JP | 2006303356 | 2/2006 |

OTHER PUBLICATIONS

Evans, U.S. Appl. No. 12/014,940, Office Action Communication, FIS920070242US1, Aug. 28, 2012, 11 pages.

(Continued)

*Primary Examiner* — Dimple Bodawala
(74) *Attorney, Agent, or Firm* — Steven J. Meyers; Hoffman Warnick LLC

(57) ABSTRACT

Methods of removing material from a defective opening in a glass mold using a laser pulse, repairing a glass mold and a related glass mold for injection molded solder (IMS) are disclosed. In one embodiment, a method includes providing a glass mold including a plurality of solder filled openings; identifying a defective opening in the glass mold; removing material from the defective opening by applying a laser pulse to the defective opening; and repairing the defective opening by filling the defective opening with an amount of solder by: removing a redundant, non-defective solder portion from an opening in the glass mold by applying a laser pulse to the opening, and placing the redundant, non-defective solder portion in the defective opening.

4 Claims, 2 Drawing Sheets

(56) References Cited

U.S. PATENT DOCUMENTS

| | | | |
|---|---|---|---|
| 5,775,569 | A | 7/1998 | Berger et al. |
| 6,003,757 | A | 12/1999 | Beaumont et al. |
| 6,056,191 | A | 5/2000 | Brouillette et al. |
| 6,105,852 | A | 8/2000 | Cordes et al. |
| 6,133,633 | A | 10/2000 | Berger et al. |
| 6,149,122 | A | 11/2000 | Berger et al. |
| 6,231,333 | B1* | 5/2001 | Gruber et al. ............. 425/546 |
| 6,332,569 | B1 | 12/2001 | Cordes et al. |
| 6,390,439 | B1 | 5/2002 | Cordes et al. |
| 6,425,518 | B1 | 7/2002 | Gruber et al. |
| 6,435,401 | B1 | 8/2002 | Miitsu et al. |
| 6,527,158 | B1 | 3/2003 | Brouillette et al. |
| 6,769,599 | B1 | 8/2004 | Momeni et al. |
| 6,911,388 | B2* | 6/2005 | Kee et al. ............. 438/613 |
| 7,348,270 | B1 | 3/2008 | Danovitch et al. |
| 8,044,320 | B2 | 10/2011 | Herz et al. |
| 8,237,086 | B2* | 8/2012 | Cohen et al. ............. 219/121.85 |
| 2003/0111449 | A1 | 6/2003 | Sinkunas et al. |
| 2005/0056625 | A1 | 3/2005 | Haight et al. |
| 2005/0263571 | A1* | 12/2005 | Belanger et al. ............. 228/256 |
| 2006/0163318 | A1 | 7/2006 | Farnworth |
| 2008/0158664 | A1 | 7/2008 | Teich et al. |
| 2008/0173697 | A1 | 7/2008 | Herz et al. |
| 2008/0179035 | A1* | 7/2008 | Gruber et al. ............. 164/113 |
| 2008/0302860 | A1* | 12/2008 | Biggs et al. ............. 228/179.1 |
| 2009/0039140 | A1* | 2/2009 | Bezama et al. ............. 228/41 |
| 2009/0179019 | A1* | 7/2009 | Cohen et al. ............. 219/121.85 |
| 2009/0179020 | A1* | 7/2009 | Cohen et al. ............. 219/121.85 |
| 2009/0183849 | A1* | 7/2009 | Budd et al. ............. 164/61 |
| 2011/0203762 | A1* | 8/2011 | Budd et al. ............. 164/61 |
| 2012/0193833 | A1* | 8/2012 | Budd et al. ............. 264/297.2 |
| 2012/0241116 | A1* | 9/2012 | Cohen et al. ............. 164/4.1 |

OTHER PUBLICATIONS

U.S. Appl. No. 12/014,959, filed Jan. 16, 2008, Office Action dated Feb. 22, 2012.

U.S. Appl. No. 12/014,940, filed Jan. 16, 2008, Office Action dated Feb. 22, 2012.

U.S. Appl. No. 12/014,959, filed Jan. 16, 2008, Office Action dated Sep. 15, 2011.

U.S. Appl. No. 12/014,940, filed Jan. 16, 2008, Office Action dated Sep. 15, 2011.

Evans, U.S. Appl. No. 12/014,959, Notice of Allowance and Fees Due, FIS920070477US1, May 18, 2012, 9 pages.

* cited by examiner

REMOVING MATERIAL FROM DEFECTIVE OPENING IN GLASS MOLD AND RELATED GLASS MOLD FOR INJECTION MOLDED SOLDER

CROSS-REFERENCE TO RELATED APPLICATIONS

This application is a divisional of U.S. Pat. No. 8,237,086, issued on Aug. 7, 2013, hereby incorporated by reference in its entirety.

BACKGROUND

1. Technical Field

The disclosure relates generally to chip package fabrication, and more particularly, to methods and a related mold for injection molded solder (IMS).

2. Background Art

In the integrated circuit (IC) chip packaging industry, injection molded solder (IMS) is a widely used process for forming structures on a wafer. IMS includes using a glass mold having numerous openings that are filled with solder. The solder is then transferred from the openings to a wafer forming structures such as controlled collapse chip connects (C4). IMS may also be used to form a wide variety of other structures. Unfortunately, sometimes the fill process of the openings on the mold is not perfect and there are fill related defects on the mold. These defects must be repaired if a perfect wafer is to be produced. Currently, there is no automated process to correct the defects and a manual defect picking and replacement operation to repair the molds is used.

SUMMARY

Methods of removing material from a defective opening in a glass mold using a laser pulse, repairing a glass mold and a related glass mold for injection molded solder (IMS) are disclosed. In one embodiment, a method includes providing a glass mold including a plurality of solder filled openings; identifying a defective opening in the glass mold; removing material from the defective opening by applying a laser pulse to the defective opening; and repairing the defective opening by filling the defective opening with an amount of solder by: removing a redundant, non-defective solder portion from an opening in the glass mold by applying a laser pulse to the opening, and placing the redundant, non-defective solder portion in the defective opening.

A first aspect of the disclosure provides a method including: providing a glass mold including a plurality of solder filled openings; identifying a defective opening in the glass mold; removing material from the defective opening by applying a laser pulse to the defective opening; and repairing the defective opening by filling the defective opening with an amount of solder by: removing a redundant, non-defective solder portion from an opening in the glass mold by applying a laser pulse to the opening, and placing the redundant, non-defective solder portion in the defective opening.

A second aspect of the disclosure provides an injection molding solder (IMS) mold including: a plurality of a plurality of solder filled openings; and at least one empty opening, wherein the plurality of solder filled openings includes at least one repaired opening filled with a solder from the at least one empty opening.

A third aspect of the disclosure provides an injection molding solder (IMS) mold including: a plurality of solder filled openings; and at least one empty opening, wherein the plurality of solder filled openings includes at least one repaired opening filled with a solder from the at least one empty opening, wherein the at least one empty opening is formed by removing the solder from a solder filled opening in the plurality of solder filled openings, and wherein the repaired opening is filled with the solder using a solder jetting tool.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
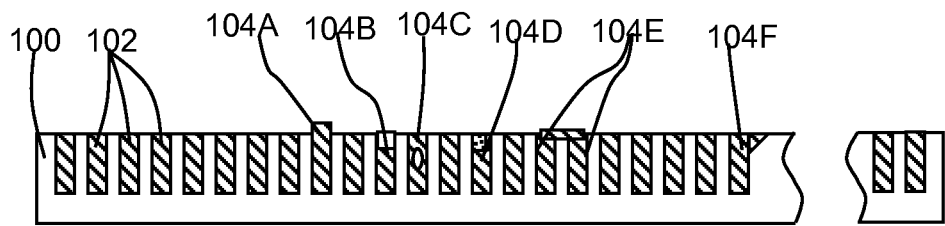
FIG. 1 shows a glass mold including defective openings.

Methods of removing material from a defective opening in a glass mold using a laser pulse, repairing a glass mold and a related glass mold for injection molded solder (IMS) are disclosed. FIG. 1 shows a glass mold 100 including a plurality of solder filled openings 102. In one embodiment, glass mold 100 may be used for any now known or later developed injection molded solder (IMS) process. In one embodiment, plurality of solder filled openings 102 may include greater than one million openings for forming a controlled collapse chip connect (C4). However, as understood by those with skill in the art, IMS has a wide variety of applications beyond this particular case. Solder filled openings 102 may take a variety of forms, e.g., cylindrical, square, trenches, etc. The solder may take the form of any now known or later developed solder material, e.g., tin (Sn), lead tin alloys (eutechic, 97/3, 95/5), tin alloys (SnCu, SnAg, SnAgCu, and the previous with Ge or Mo additives), etc. Glass mold 100 may be made of any now known or later developed mold material (e.g., borosilicate, quartz, silicon, etc.).

Glass mold 100 also includes a number of illustrative defective openings 104A-104F. A defective opening may take a variety of forms such as, but not limited to: an overfilled opening 104A, an underfilled opening 104B, a void-including opening 104C, a contaminant-including opening 104D, shorted opening(s) 104E and/or an incorrectly dimensioned opening 104F within the glass (latter shown as an overly large opening). One or more of defective openings 104A-104F may occur in any given glass mold 100. Note, the term "defective opening" is used broadly to include openings including the above described problems and those having included (now emptied of) the above described problems.

Figure 2:
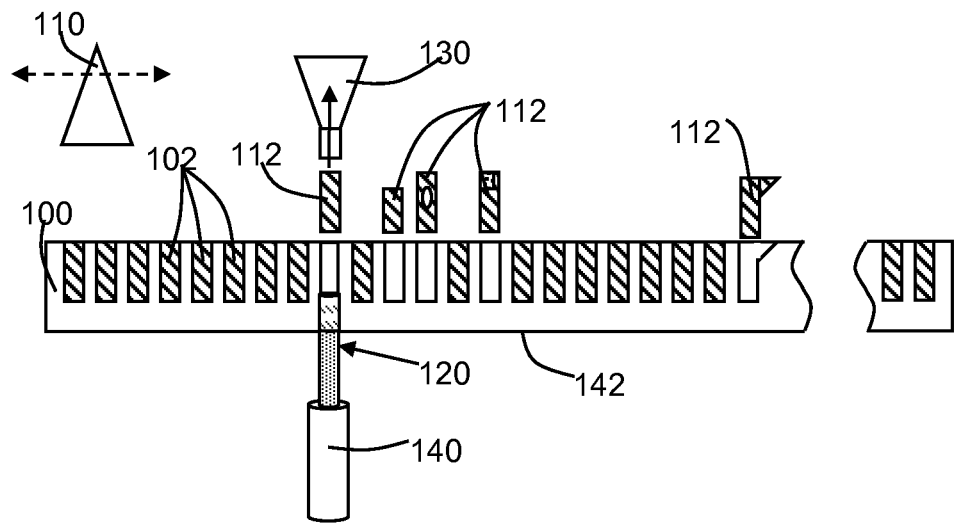
FIGS. 2-4 show embodiments of methods of removing a defective opening and repairing a defective opening in the glass mold of FIG. 1 according to the disclosure.
Figure 3A:
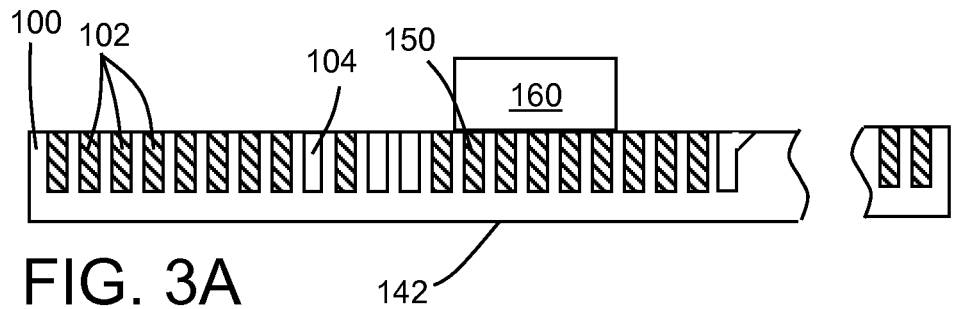
Figure 3B:
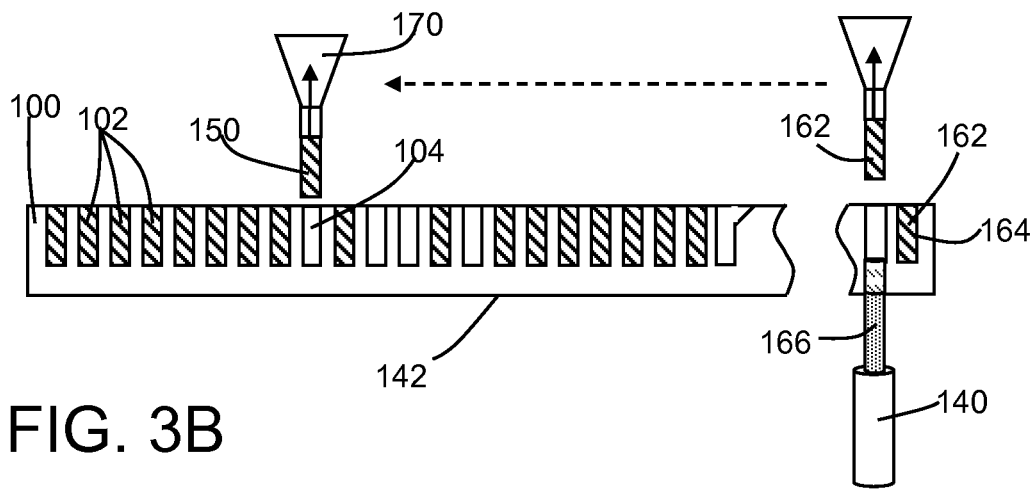
Figure 4:
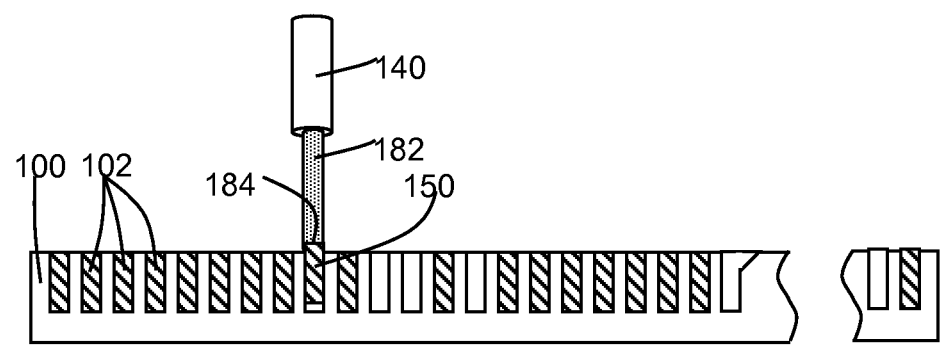

FIGS. 2-4 show embodiments of methods of removing a defective opening 104 (FIG. 1) and repairing a defective opening 104 (FIG. 1) in glass mold 100 according to the disclosure. FIG. 2 shows identifying a defective opening 104 in glass mold 102. This process may be carried out using any now known or later developed optical evaluation tool 110, e.g., Suss Microtec's Mold Inspection Tool or other commercially available pattern recognition system, capable of detecting a defective opening 104. The pattern recognition machine may identify each mold defect by type (missing solder, extra solder, etc.) to facilitate the repair process and mold fill process learning.

FIG. 2 also shows removing material 112 from defective opening 104 (FIG. 1) by applying a laser pulse 120 to the defective opening. "Material" 112 may include solder, contaminants, parts of glass mold 100 or other matter constituting or causing defective opening 104, or combinations thereof. A vacuum 130 may be applied to capture material 112 from defective opening 104. Vacuum 130 may be applied by a vacuum tip (as shown) or by a wider area application. Laser pulse 120 may be applied using a laser system 140, which may include, for example, a solid state laser system 140 such as those available from New Wave, or an excimer laser system. Laser pulse 120 may have any wavelength capable of applying a force significant enough to remove solder from defective opening 104 (FIG. 1), for example, 308 nm, 532 nm, etc. Nearly any pulsed laser system with a wavelength strongly absorbed by the solder but not by the mold material would function as part of this disclosure. Laser system 140 is configured to be positioned according to the results of the evaluation by optical evaluation tool 110 such that laser pulse 120 passes through a back side 142 of glass mold 100 at a defective opening 104 (FIG. 1). Laser pulse 120 ejects material 112 of defective opening 104 (FIG. 1). The removal may be repeated, as shown in FIG. 2, for any number of defective openings 104 (FIG. 1), and can be automated to make the process accurate, quick and less costly. In one embodiment, laser pulse 120 may include a plurality of laser pulses, however, this may not be necessary in all instances.

FIG. 3A shows one embodiment of a method of repairing defective opening 104 (FIG. 1) by filling the emptied defective opening with an amount of solder 150. In one embodiment, defective opening 104 (now empty as shown in FIG. 3) may be filled using a well-known solder jetting tool 160 such as those available from Microfab, which fills defective opening 104 with amount of solder 150. However, in some instances, use of a solder jetting tool 160 may be difficult since different solders may be used within a given fabrication setting and different amounts of solder 150 may be required. In this case, solder jetting tool 160 customization for, among other things, each solder, presents a challenge. Furthermore, this approach does not allow for placing a correct amount of solder 150 in a defective opening 104F (FIG. 1) that is constituted by an overly large opening in glass mold 100.

FIG. 3B shows another embodiment of a method of repairing defective opening 104 (FIG. 1) by filling the emptied defective opening with an amount of solder 150. In this embodiment, glass mold 100 is provided with a number of redundant, non-defective solder portions 162 that include amount of solder 150. A redundant, non-defective solder portion 162 is removed from an opening 164 in glass mold 100 by applying a laser pulse 166 to the opening, i.e., through back side 142 of glass mold 100. A vacuum tip 170 may be used to carry and place redundant, non-defective solder portion 162 (i.e., amount of solder 150) in defective opening 104. This vacuum tip would typically have an opening size approximately 50% of the diameter of the mold features being repaired. In one embodiment, shown in FIG. 4, the placing may include using a laser pulse 182 to assist in forcing amount of solder 150 into defective opening 104. Further, laser pulse 182 may also melt a surface 184 of redundant, non-defective solder portion 162 (i.e., amount of solder 150), which assists in adherence of amount of solder 150 in the opening. The same or different laser system 140 may be used for removing material 112 (FIG. 2), removing solder portion 162 (FIG. 3B) or placing amount of solder 150 (FIG. 4).

The repair process of either FIG. 3A or 3B can be automated to make the process accurate, quick and less costly.

Figure 5:
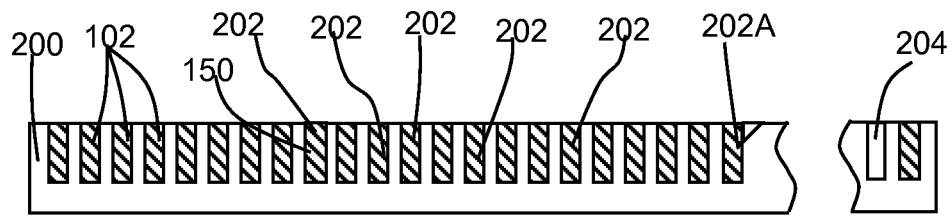
FIG. 5 shows embodiments of a repaired glass mold according to the disclosure.

FIG. 5 shows a repaired mold 200 for IMS including a plurality of a plurality of solder filled openings 102, and at least one empty opening 204 (from removal of solder portion 162). Solder filled openings 102 include at least one repaired opening 202 filled with a solder (i.e., amount of solder 150) from the at least one empty opening 164. As illustrated by repaired opening 202, the repair process using redundant, non-defective openings 162 (FIG. 3B) described above allows for the correct amount of solder 150 to be placed in defective opening 104F (FIG. 1), despite a defect in the form of an overly large opening in glass mold 100.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An injection molding solder (IMS) mold comprising:
   a plurality of solder filled openings; and
   an empty opening, previously filled with solder;
   wherein the plurality of solder filled openings includes a repaired opening filled with the solder that previously filled the empty opening.

2. The IMS mold of claim 1, wherein the empty opening is formed by removing the solder from a solder filled opening in the plurality of solder filled openings.

3. The IMS mold of claim 1, wherein the repaired opening is filled with the solder using a solder jetting tool.

4. An injection molding solder (IMS) mold comprising:
   a plurality of solder filled openings; and
   an empty opening, previously filled with solder;
   wherein the plurality of solder filled openings includes at least one repaired opening filled with the solder that previously filled the empty opening,
   wherein the empty opening is formed by removing the solder from a solder filled opening in the plurality of solder filled openings, and
   wherein the repaired opening is filled with the solder using a solder jetting tool.

* * * * *